United States Patent
Inaba (10) Patent No.: US 8,169,009 B2
(45) Date of Patent: May 1, 2012

(54) SEMICONDUCTOR DEVICE

(75) Inventor: Satoshi Inaba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 12/494,885

(22) Filed: Jun. 30, 2009

(65) Prior Publication Data

US 2010/0025767 A1 Feb. 4, 2010

(30) Foreign Application Priority Data

Aug. 1, 2008 (JP) ................................ 2008-199453

(51) Int. Cl.
*H01L 29/76* (2006.01)

(52) U.S. Cl. ......................... 257/288; 257/249; 257/401

(58) Field of Classification Search .................... 257/288
See application file for complete search history.

(56) References Cited

U.S. PATENT DOCUMENTS

| | | | |
|---|---|---|---|
| 6,525,403 B2 | 2/2003 | Inaba et al. | |
| 7,112,858 B2 | 9/2006 | Inaba et al. | |
| 7,361,958 B2 * | 4/2008 | Brask et al. | 257/369 |
| 7,432,122 B2 * | 10/2008 | Mathew et al. | 438/48 |
| 7,456,476 B2 * | 11/2008 | Hareland et al. | 257/349 |
| 7,573,114 B2 * | 8/2009 | Mathew et al. | 257/458 |
| 7,608,893 B2 * | 10/2009 | Orlowski | 257/347 |
| 7,691,695 B2 * | 4/2010 | Ponomarev | 438/197 |
| 7,820,513 B2 * | 10/2010 | Hareland et al. | 438/283 |
| 2003/0151077 A1 * | 8/2003 | Mathew et al. | 257/250 |
| 2005/0186742 A1 * | 8/2005 | Oh et al. | 438/283 |
| 2006/0172497 A1 * | 8/2006 | Hareland et al. | 438/286 |
| 2006/0216880 A1 | 9/2006 | Suto | |
| 2007/0183185 A1 * | 8/2007 | Guo et al. | 365/156 |
| 2007/0262386 A1 * | 11/2007 | Gossner et al. | 257/355 |
| 2008/0265290 A1 * | 10/2008 | Nielsen et al. | 257/288 |
| 2008/0303096 A1 * | 12/2008 | Schulz | 257/365 |
| 2008/0308848 A1 | 12/2008 | Inaba | |
| 2008/0308880 A1 * | 12/2008 | Inaba | 257/401 |
| 2009/0001426 A1 * | 1/2009 | Cheng et al. | 257/213 |
| 2009/0007036 A1 * | 1/2009 | Cheng et al. | 716/5 |
| 2009/0061572 A1 * | 3/2009 | Hareland et al. | 438/157 |
| 2009/0065869 A1 | 3/2009 | Ohguro et al. | |
| 2009/0085121 A1 * | 4/2009 | Park et al. | 257/368 |
| 2009/0134472 A1 | 5/2009 | Inaba | |
| 2009/0309162 A1 * | 12/2009 | Baumgartner et al. | 257/368 |
| 2010/0164530 A1 * | 7/2010 | Hoentschel et al. | 324/765 |

FOREIGN PATENT DOCUMENTS

JP 2006-269975 10/2006

OTHER PUBLICATIONS

Digh Hisamoto, et al., "A Folded-channel MOSFET for Deep-sub-tenth Micron Era", IEEE 1998, 3 pages.
Yang-Kyu Choi, et al., "Sub-20nm CMOS FinFET Technologies", IEEE 2001, 4 pages.

* cited by examiner

*Primary Examiner* — Eugene Lee
*Assistant Examiner* — Mohammed Shamsuzzaman
(74) *Attorney, Agent, or Firm* — Oblon, Spivak, McClelland, Maier & Neustadt, L.L.P.

(57) ABSTRACT

A semiconductor device includes N fins made of semiconductor regions aligned in parallel with each other in the top view plain, a gate electrode formed on both side surfaces of each of the N fins to cross the fins, source/drain layers formed in each of the N fins by sandwiching the gate electrode, a first wiring connected to one of the source/drain layers via a first contact formed in each of M fins, and a second wiring connected to the other one of the source/drain layers via a second contact formed in each of K fins.

6 Claims, 6 Drawing Sheets

SEMICONDUCTOR DEVICE

CROSS-REFERENCE TO RELATED APPLICATIONS

This application is based upon and claims the benefit of priority from the prior Japanese Patent Application No. 2008-199453, filed on Aug. 1, 2008; the entire contents of which are incorporated herein by reference.

BACKGROUND

In semiconductor integrated circuit devices, high performance and high logic gate density integration of field-effect transistors are achieved by miniaturization of a gate length following the scaling rule and decreasing a thickness of a gate dielectric film. However, if a gate length of a field-effect transistor becomes equal to or smaller than 30 nanometers, the influence of a short-channel effect should be large, and a cutoff characteristic should be degraded. Therefore, to obtain a favorable cutoff characteristic, there has been proposed a double-gate transistor having fins formed on a silicon-on-insulator (SOI) substrate or on a bulk substrate, having a gate electrode manufactured to cross the fins, and having channels formed at both sides of each fin.

According to such a double-gate transistor, the variation of a threshold voltage is small, the output resistance can be large. If double gate transistors can be installed for the application of a base-band (low frequency) analog devices together with a digital devices, its fabrication cost can be reduced because they are fabricated by almost the same process on the same wafer.

For example, Japanese Patent Application Laid-open No. 2006-269975 discloses a method of reducing a parasitic resistance of fin portions of a fin field-effect transistor (FinFET) and suppressing the variation of the resistance between a source and a channel and between a drain and a channel of the FinFET, by crystal epi-growth of a semiconductor layer connecting between the fin portions, on an upper surface and side surfaces of the fin portions positioned at both sides of a gate electrode.

However, the double-gate transistor has a very small width of fins, has a large parasitic resistance, and has variation of the fin width. Therefore, if a base-band analog circuit is formed with a double-gate transistor with larger parasitic resistance by using a similar design method for a bulk transistor formed on a bulk substrate, sufficient gain cannot be achieved or the characteristic variation of the analog circuit should be degraded.

SUMMARY

A semiconductor device according to an embodiment of the present invention comprises: N (N is an integer equal to or larger than 2) fins made of a semiconductor material aligned in parallel with each other; a gate electrode formed on both side surfaces of each of the N fins to cross the fins; source/drain layers formed in each of the N fins by sandwiching the gate electrode; a first wiring connected to one of the source/drain layers via a first contact formed in each of M fins (M is an integer equal to or larger than 2 and equal to or smaller than N); and a second wiring connected to the other one of the source/drain layers via a second contact formed in each of K fins (K is an integer smaller than M).

A semiconductor device according to an embodiment of the present invention comprises: N (N is an integer equal to or larger than 2) fins made of a semiconductor material aligned in parallel with each other; a first gate electrode formed on both side surfaces of each of the N fins to cross the fins; and a second gate electrode formed in parallel with the first gate electrode on both side surfaces of the N fins to cross the fins, wherein a gate length of the second gate electrode is larger than a gate length of the first gate electrode, and a constant current source is configured by a transistor having the second gate electrode.

A semiconductor device according to an embodiment of the present invention comprises: N (N is an integer equal to or larger than 2) fins made of a semiconductor material aligned in parallel with each other; a first gate electrode formed on both side surfaces of each of the N fins to cross the fins; and a second gate electrode formed in parallel with the first gate electrode on both side surfaces of the N fins to cross the fins, and having a larger gate length than a gate length of the first gate electrode, wherein the number of fins formed with contacts of source/drain layers of first field-effect transistors having the first gate electrode is larger than the number of fins formed with contacts of source/drain layers of second field-effect transistors having the second gate electrode.

DETAILED DESCRIPTION OF THE INVENTION

Exemplary embodiments of a semiconductor device according to the present invention will be explained below in detail with reference to the accompanying drawings. The present invention is not limited to the embodiments.

Figure 1:
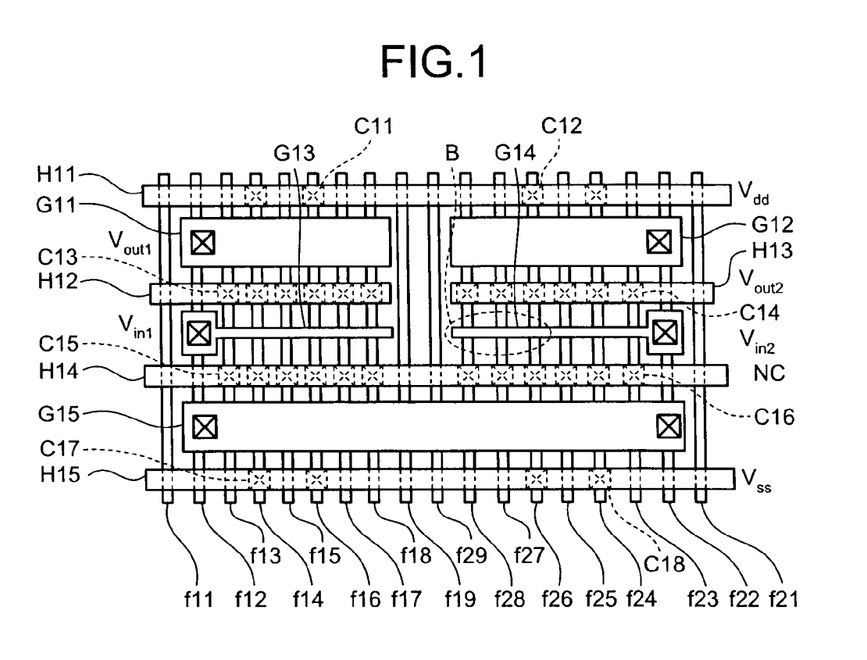
FIG. 1 is a plan view of a layout configuration of a semiconductor device according to a first embodiment.

FIG. 1 is a plan view of a layout configuration of a semiconductor device according to a first embodiment.

In FIG. 1, plural fins f11 to f19 and f21 to f29 are aligned in parallel with each other. Preferably, the width of each of the fins f11 to f19 and f21 to f29 is equal to each other, and the interval between fins of the fins f11 to f19 and f21 to f29 is equal to each other. Preferably, the total number of the fins f11 to f19 and the total number of the fins f21 to f29 are even numbers. A semiconductor material can be used for the material of the fins f11 to f19 and f21 to f29. For examples, the material can be selected from Si, Ge, SiGe, SiC, SiSn, PbS, GaAs, InP, GaP, GaN, ZnSe, and GaInAsP.

For the fins f13 to f18, gate electrodes G11 are formed on both side surfaces of the fins f13 to f18 to cross the fins f13 to f18. For the fins f23 to f28, gate electrodes G12 are formed on both side surfaces of the fins f23 to f28 to cross the fins f23 to f28.

For the gate electrodes G11 and G12, gate electrodes G13 and G14 are aligned in parallel at a predetermined interval, respectively. For the fins f13 to f18, the gate electrodes G13 are formed on both side surfaces of the fins f13 to f18 to cross the fins f13 to f18. For the fins f23 to f28, the gate electrodes G14 are formed on both side surfaces of the fins f23 to f28 to cross the fins f23 to f28.

Further, for the gate electrodes G13 and G14, gate electrodes G15 are aligned at a predetermined interval. For the fins f13 to f18 and f23 to f28, the gate electrodes G15 are formed on both side surfaces of the fins f13 to f18 and f23 to f28 to cross the fins f13 to f18 and f23 to f28.

Preferably, the gate electrodes G11, G12, and G15 can have a larger gate length than that of the gate electrodes G13 and G14. Preferably, a drain resistance in a saturation region of transistors having the gate electrodes G11, G12, and G15 is set to be assumed that it is substantially infinite ($dI_d/dV_d=1/R_d$ to 0). Preferably, a gate length of the gate electrodes G13 and G14 is set as small as possible to increase mutual conductance and to increase gain, and can be set equal to or smaller than 30 nanometers, for example.

Source/drain layers are formed in the fins f13 to f18 and f23 to f28 at both sides of the gate electrodes G11 to G15, respectively. The source/drain layers formed in the fins f13 to f18 between the gate electrode G11 and the gate electrode G13 are shared by the gate electrodes G11 and G13. The source/drain layers formed in the fins f23 to f28 between the gate electrode G12 and the gate electrode G14 are shared by the gate electrodes G12 and G14. The source/drain layers formed in the fins f13 to f18 between the gate electrode G13 and the gate electrode G15 are shared by the gate electrodes G13 and G15. The source/drain layers formed in the fins f23 to f28 between the gate electrode G14 and the gate electrode G15 are shared by the gate electrodes G14 and G15.

The fins f13 and f15 at a drain side at the side of the gate electrodes G11 are connected to a wiring H11 via contacts C11, respectively. The fins f23 and f25 at a drain side at the side of the gate electrodes G12 are connected to the wiring H11 via contacts C12, respectively. The fins f13 to f18 at a source side at the side of the gate electrodes G11 are connected to a wiring H12 via contacts C13, respectively. The fins f23 to f28 at a source side at the side of the gate electrodes G12 are connected to a wiring H13 via contacts C14, respectively.

The fins f13 to f18 and f23 to f28 at a drain side at the side of the gate electrodes G15 are connected to a wiring H14 via contacts C15 and C16, respectively. The fins f14 to f16 and f24 to f26 at a source side at the side of the gate electrodes G15 are connected to a wiring H15 via contacts C17 and C18, respectively. Metals such as Al and Cu can be used for the material of the wirings H11 to H15.

Preferably, the contacts C1 to C15 are symmetrically placed, respectively. Preferably, the gate electrodes G11 and G12 are aligned symmetrically with each other. Preferably, the gate electrodes G13 and G14 are aligned symmetrically with each other. Preferably, the wirings H12 and H13 are aligned symmetrically with each other. Embedded wirings formed on the fins f13 to f18 and f23 to f28 can be used for the contacts C11 to C15.

Out of the fins f11 to f19 and f21 to f29, the fins (f11 & f12) and (f21 & f22) can be used as dummy fins; They can not be used as a part of field-effect transistors.

Figure 2:
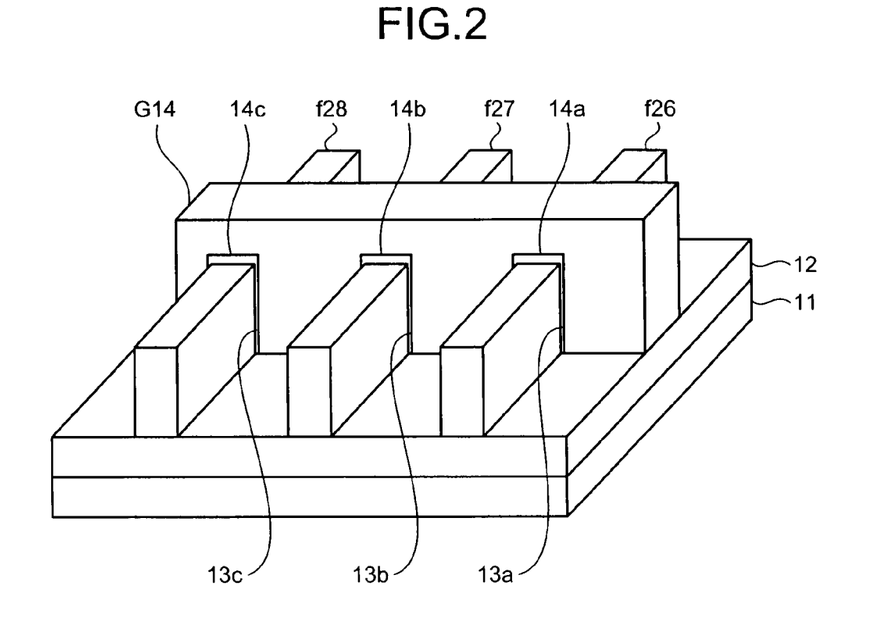
FIG. 2 is a perspective view of a schematic configuration of a portion B in FIG. 1.

FIG. 2 is a perspective view of a schematic configuration of a portion B in FIG. 1.

In FIG. 2, an isolation layer 12 is formed on a semiconductor substrate 11, and the fins f26 to f28 are aligned in parallel on the isolation layer 12. For the fins f26 to f28, the gate electrodes G14 are formed on both side surfaces of the fins f26 to f28 via gate dielectric films 13a to 13c, respectively. Upper insulation films 14a to 14c are formed between upper surfaces of the fins f26 to f28 and the gate electrodes G14.

Because of no intentional doping into the fins f26 to f28, channels formed in the fins f26 to f28 can be fully depleted and can operate as an intrinsic channel device. To adjust a threshold voltage of field-effect transistors formed in the fins f26 to f28, metal compounds such as titanium nitride, tantalum carbon, a lanthanum material, an aluminum material, and a magnesium material can be used as a single unit or in combination, for the material of the gate electrodes G14.

Figure 3:
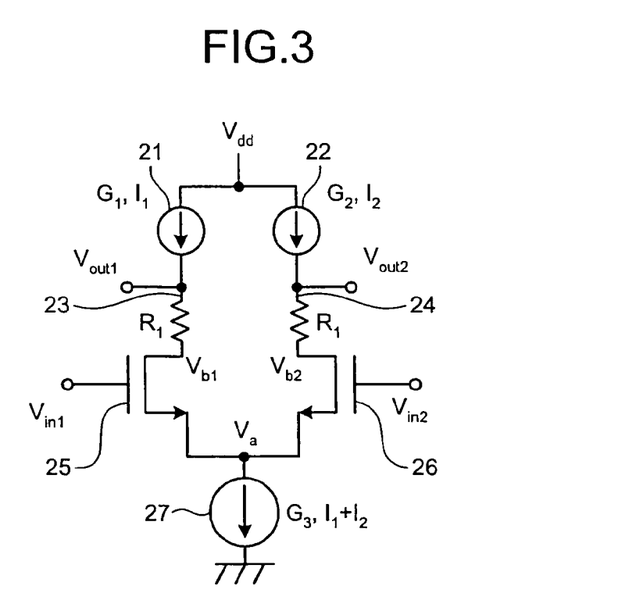
FIG. 3 depicts an equivalent circuit of the semiconductor device shown in FIG. 1.

FIG. 3 depicts an equivalent circuit of the semiconductor device shown in FIG. 1. The equivalent circuit is used for a common-mode feedback (CMFB) circuit or the like.

In FIG. 3, a constant current source 21 is connected to a drain of a field-effect transistor 25 via a resistor 23, and a constant current source 22 is connected to a drain of a field-effect transistor 26 via a resistor 24. A constant current source 27 is connected in common to sources of the field-effect transistors 25 and 26.

The constant current source 21 can be configured by the gate electrodes G11 and the fins f13 to f18 shown in FIG. 1. The constant current source 22 can be configured by the gate electrodes G12 and the fins f23 to f28 shown in FIG. 1. The field-effect transistor 25 can be configured by the gate electrodes G13 and the fins f13 to f18 shown in FIG. 1. The field-effect transistor 26 can be configured by the gate electrodes G14 and the fins f23 to f28 shown in FIG. 1. The constant current source 27 can be configured by the gate electrodes G15 and the fins f13 to f19 and f23 to f29 shown in FIG. 1. The resistor 23 can be related to parasitic resistances of the fins f13 to f18 between the gate electrode G11 and the gate electrode G13. The resistor 24 can be related to parasitic resistances of the fins f23 to f28 between the gate electrode G12 and the gate electrode G14.

The wiring H11 shown in FIG. 1 is connected to a power source potential (voltage) $V_{dd}$, and the wiring H15 is connected to a ground potential (voltage) $V_{ss}$. If input voltages $V_{in1}$ and $V_{in2}$ are applied to the gate electrodes G13 and G14, respectively, output voltages $V_{out1}$ and $V_{out2}$ are output from the wirings H12 and H13, respectively, thereby causing the field-effect transistors operate as differential amplifiers.

Even If the gate length is decreased, a short-channel effect can be suppressed enough thanks to the characteristics of the double-gate transistors for the field-effect transistors 25 and 26 shown in FIG. 3. With double gate transistors, the gain can be increased even in the case of suppressing the short channel effect. Because a double-gate transistor is an intrinsic channel device, the double-gate transistor can suppress the variation of a threshold voltage, which is caused by random dopant fluctuation. A matching characteristics can be improved, even though the field-effect transistors 25 and 26 are differentially operated.

The fins f11 to f19 and f21 to f29 have a small fin width. Although the parasitic resistance of each of the fins f11 to f19 and f21 to f29 is large, the parasitic resistance between the gate electrode G11 and the gate electrode G13, and the parasitic resistance between the gate electrode G12 and the gate electrode G14 can be decreased by increasing the numbers of the fins f11 to f19 and f21 to f29. Therefore, the reduction of the gain can be suppressed. To decrease the parasitic resistance between the gate electrode G11 and the gate electrode G13, the interval between the gate electrode G11 and the gate electrode G13 is preferably as small as possible, and the gate electrodes G11 and G13 can be superimposed with the wiring H12. To decrease the parasitic resistance between the gate electrode G12 and the gate electrode G14, the interval between the gate electrode G12 and the gate electrode G14 is preferably as small as possible, and the gate electrodes G12 and G14 can be superimposed with the wiring H13.

By setting the gate length of the gate electrodes G11, G12, and G15 larger than the gate length of the gate electrodes G13 and G14, double-gate transistors can be used for the constant current sources 21 and 22 shown in FIG. 3. The constant current sources 21 and 22 for supplying a constant current to the field-effect transistors 25 and 26 can be formed in the same fins.

If the fins f11 to f19 and f21 to f29 are aligned at equal intervals, transistors can be formed by a pattern having a simple repetition of a straight line and a space. Therefore, the sizes of the fins f11 to f19 and f21 to f29 can be easily managed, and size controllability of the fins f11 to f19 and f21 to f29 can be improved. Consequently, a matching characteristic of a differential analog circuit can be improved.

The numbers of the fins f11 to f19 and f21 to f29 are set to even numbers to have the symmetrical geometry therefore, the fins f11 to f19 and f21 to f29 can be formed by a sidewall transfer process which forms the fin-fin pair. Further, an arrangement pitch of the fins f11 to f19 and f21 to f29 can be reduced by the sidewall transfer process.

Out of the fins f11 to f19 and f21 to f29, the fins f11, f12, f21, and f22 are aligned at both ends, and are used as dummy fins. Therefore, such field-effect transistors can be manufactured, having the pattern regularity for the lithography and the etching process. Further, the variation of a direct current (DC) characteristic of a threshold voltage and the like can be suppressed, and the degradation of short-channel effect can be also suppressed, because of the excellent pattern regularity.

For example, the fins f11 to f19 and f21 to f29 are aligned from the device region to device isolation region; i.e. from the region where fins are regularly placed to the region where the fins are placed without the same regularity. In a portion which suddenly changes the pattern regularity to near an isolated pattern, an etching condition should be changed, and the bottom portions of the fins f11, f12, f21, and f22 become thick in a tapered shape. Even at a time of applying lithography, the sizes of fins aligned at both ends are deviated from the sizes of fins aligned at the inside.

Therefore, if a field effect transistor is manufactured with enough pattern regularity, a variability of DC characteristics of the field-effect transistor can be improved.

If the numbers of the contacts C13 to C16 connected to the wirings H12 to H14 are set larger than the numbers of the contacts C11, C12, C17, and C18 connected to the wirings H11 and H15, an effective channel width (=number of fins× height of fins×2) of a current flowing through the field-effect transistors 25 and 26 in FIG. 3 can be increased, and an effective channel width of a current flowing through the constant current sources 21 and 22 in FIG. 3 can be decreased at the same time.

Therefore, while decreasing (drain) conductance of the constant current sources 21 and 22, a current flowing through the field-effect transistors 25 and 26 can be increased, and the frequency response of the field-effect transistors 25 and 26 can be improved.

If the contacts C11 to C15 are symmetrically aligned, a current path can be shortened because a current, entering the fins f14 and f16 via the contacts C11, can be spread to whole drain region of the field-effect transistor 25. Even though the number of the contacts C11 connected to the wiring H11 is limited, increase of a delay time can be also suppressed thanks to the symmetrical contact allocation.

In the first embodiment, a method of using the fins f11, f12, f21, and f22 aligned at both ends as dummy fins, out of the fins f11 to f19 and f21 to f29, is explained. Instead of using each two fins of the fins f11, f12, f21, and f22 aligned at both ends as dummy fins, each one of the fins aligned at both ends can be also used as a dummy fin. Alternatively, three or more fins aligned at both ends can be used as dummy fins.

In the first embodiment, a method of forming the contacts C11 and C12 is also explained which are connected to the wiring H11, in only the fins f14, f16, f24, and f26. However, the number of the contacts C11 and C12 connected to the wiring H11 is not necessarily limited to two, and can be any number larger than that of the contacts C13 and C14 connected to the wirings H12 and H13, respectively. For example, the contacts C11 and C12 connected to the wiring H11 can be aligned to be formed in only the fins f15 and f25, respectively, or can be aligned to be formed in only the fins f13, f15, f17, f23, f25, and f27, respectively.

In the first embodiment, a method of forming the contacts C17 and C18 is also explained which are connected to the wiring H15, in only the fins f14, f16, f24, and f26, respectively. However, the number of the contacts C17 and C18 connected to the wiring H15 is not necessarily limited to two, and can be any number larger than that of the contacts C15 and C16 connected to the wiring H14. For example, the contacts C17 and C18 connected to the wiring H15 can be aligned to be formed in only the fins f15 and f25, respectively, or can be aligned to be formed in only the fins f13, f15, f17, f23, f25, and f27, respectively.

A relationship between the gain (=voltage gain) A of the circuit and a resistance value $R_1$ of the resistors 23 and 24 is explained below by the following equations.

If $V_{in1}$ and $V_{in2}$ represent input voltages of the circuit, and also If $V_{out1}$ and $V_{out2}$ represent output voltages of the circuit, basic equations of the circuit shown in FIG. 3 are given by equations (1) to (7) as follows.

$$V_a = \frac{I_1 + I_2}{G_3} \quad (1)$$

$$V_{out1} - B_{b1} = R_1 I_1 \quad (2)$$

$$V_{out2} - V_{b2} = R_1 I_2 \quad (3)$$

$$I_1 = g_m(V_{in1} - V_a) + \frac{1}{r_{ds}}(V_{b1} - V_a) \quad (4)$$

$$I_2 = g_m(V_{in2} - V_a) + \frac{1}{r_{ds}}(V_{b2} - V_a) \quad (5)$$

$$V_{dd} = \frac{I_1}{G_1} + V_{out1} \quad (6)$$

$$V_{dd} = \frac{I_2}{G_2} + V_{out2} \quad (7)$$

In the above equations, $G_1$, $G_2$, and $G_3$ represent (drain) conductance of the constant current sources 21 and 22, respectively, and $I_1$, $I_2$, and $I_1+I_2$ represent currents flowing through the constant current sources 21 and 22, respectively. $V_{dd}$ represents a power source potential, $g_m$ represents mutual conductance of the field-effect transistors 25 and 26, $V_a$ represents a source potential of the field-effect transistors 25 and 26, $V_{b1}$ and $V_{b2}$ represent drain potentials of the field-effect transistors 25 and 26, respectively, and $r_{ds}$ represents an inclination of an $I_d$-$V_d$ characteristic of the field-effect transistors 25 and 26. $I_d$ represents a drain current of the field-effect transistors 25 and 26, and $V_d$ represents a drain voltage of the field-effect transistors 25 and 26.

$I_1$ and $I_2$ are obtained from the basic equations of equations (1) to (7), and a relationship between the input voltages $V_{in1}$ and $V_{in2}$ and the output voltages $V_{out1}$ and $V_{out2}$ is finally obtained.

First, equations (8) and (9) are obtained as follows, by the equations (1), (4), and (5).

$$I_1 = g_m\left(V_{in1} - \frac{I_1+I_2}{G_3}\right) + \frac{1}{r_{ds}}\left(V_{b1} - \frac{I_1+I_2}{G_3}\right) \quad (8)$$

$$I_2 = g_m\left(V_{in2} - \frac{I_1+I_2}{G_3}\right) + \frac{1}{r_{ds}}\left(V_{b2} - \frac{I_1+I_2}{G_3}\right) \quad (9)$$

Next, equations (10) and (11) are obtained as follows by subtracting $V_{b1}$ and $V_{b2}$ from the equations (8) and (9) by using the equations (2) and (3).

$$\left(1 + \frac{g_m}{G_3} + \frac{1}{r_{ds}G_3}\right)I_1 + \left(\frac{g_m}{G_3} + \frac{1}{r_{ds}G_3}\right)I_2 = g_m V_{in1} + \frac{1}{r_{ds}}V_{b1} \quad (10)$$
$$= g_m V_{in1} + \frac{1}{r_{ds}}(V_{out1} - R_1 I_1)$$

$$\left(\frac{g_m}{G_3} + \frac{1}{r_{ds}G_3}\right)I_1 + \left(1 + \frac{g_m}{G_3} + \frac{1}{r_{ds}G_3}\right)I_2 = g_m V_{in2} + \frac{1}{r_{ds}}V_{b2} \quad (11)$$
$$= g_m V_{in2} + \frac{1}{r_{ds}}(V_{out2} - R_1 I_2)$$

Equations (12) and (13) are obtained as follows by arranging the equations (10) and (11) by $I_1$ and $I_2$.

$$\left(1 + \frac{g_m}{G_3} + \frac{1}{r_{ds}G_3} + \frac{R_1}{r_{ds}}\right)I_1 + \left(\frac{g_m}{G_3} + \frac{1}{r_{ds}G_3}\right)I_2 = g_m V_{in1} + \frac{1}{r_{ds}}V_{out1} \quad (12)$$

$$\left(\frac{g_m}{G_3} + \frac{1}{r_{ds}G_3}\right)I_1 + \left(1 + \frac{g_m}{G_3} + \frac{1}{r_{ds}G_3} + \frac{R_1}{r_{ds}}\right)I_2 = g_m V_{in2} + \frac{1}{r_{ds}}V_{out2} \quad (13)$$

An equation (14) is obtained as follows by writing the equations (12) and (13) by using a matrix and a vector format.

$$\begin{pmatrix} 1+\alpha+\frac{R_1}{r_{ds}} & \alpha \\ \alpha & 1+\alpha+\frac{R_1}{r_{ds}} \end{pmatrix}\begin{pmatrix} I_1 \\ I_2 \end{pmatrix} = g_m\begin{pmatrix} V_{in1} \\ V_{in2} \end{pmatrix} + \frac{1}{r_{ds}}\begin{pmatrix} V_{out1} \\ V_{out2} \end{pmatrix} \quad (14)$$

An equation (15) is obtained as follows by solving $I_1$ and $I_2$ by the equation (14).

$$\begin{pmatrix} I_1 \\ I_2 \end{pmatrix} = \frac{1}{\left(1+\alpha+\frac{R_1}{r_{ds}}\right)^2 - \alpha^2}\begin{pmatrix} 1+\alpha+\frac{R_1}{r_{ds}} & -\alpha \\ -\alpha & 1+\alpha+\frac{R_1}{r_{ds}} \end{pmatrix} \quad (15)$$
$$\left[g_m\begin{pmatrix} V_{in1} \\ V_{in2} \end{pmatrix} + \frac{1}{r_{ds}}\begin{pmatrix} V_{out1} \\ V_{out2} \end{pmatrix}\right]$$

In the above equations, $\alpha$ is defined by an equation (16) shown below.

$$\alpha \equiv \left(\frac{g_m}{G_3} + \frac{1}{r_{ds}G_3}\right) \quad (16)$$

$I_1$ and $I_2$ are solved by the equations (6) and (7), and are changed into a matrix and a vector format, thereby obtaining an equation (17) as follows.

$$\begin{pmatrix} I_1 \\ I_2 \end{pmatrix} = G_1\begin{pmatrix} V_{dd} - V_{out1} \\ V_{dd} - V_{out2} \end{pmatrix} = G_1\begin{pmatrix} V_{dd} \\ V_{dd} \end{pmatrix} - G_1\begin{pmatrix} V_{out1} \\ V_{out2} \end{pmatrix} \quad (17)$$

$I_1$ and $I_2$ are erased from the equations (15) and (17), thereby obtaining an equation (18) as follows.

$$G_1 M\begin{pmatrix} V_{dd} \\ V_{dd} \end{pmatrix} - g_m r_{ds}\begin{pmatrix} V_{in1} \\ V_{in2} \end{pmatrix} = (E + G_1 M)\begin{pmatrix} V_{out1} \\ V_{out2} \end{pmatrix} \quad (18)$$

In the above equation, $\beta$ is defined by an equation (19) shown below.

$$\beta \equiv \alpha r_{ds} \quad (19)$$

M is defined by an equation (20) shown below.

$$M \equiv \begin{pmatrix} r_{ds}+\beta+R_1 & \beta \\ \beta & r_{ds}+\beta+R_1 \end{pmatrix} \quad (20)$$

$V_{out1}$ and $V_{out2}$ are solved by the equation (18), thereby obtaining equations (21) and (22) as follows.

$$V_{out1} = \left(1 - \frac{1}{a+b}\right)V_{dd} + \frac{-g_m r_{ds}}{a^2-b^2}(aV_{in1} - bV_{in2}) \quad (21)$$

$$V_{out2} = \left(1 - \frac{1}{a+b}\right)V_{dd} + \frac{-g_m r_{ds}}{a^2-b^2}(-bV_{in1} + aV_{in2}) \quad (22)$$

In the above equations, a and b are defined by an equation (23) shown below.

$$\begin{pmatrix} 1+G_1 r_{ds}\left(\dfrac{1+\dfrac{g_m}{G_3}+}{\dfrac{1}{r_{ds}G_3}}\right)+G_1 R_1 & G_1 r_{ds}\left(\dfrac{g_m}{G_3}+\dfrac{1}{r_{ds}G_3}\right) \\ G_1 r_{ds}\left(\dfrac{g_m}{G_3}+\dfrac{1}{r_{ds}G_3}\right) & 1+G_1 r_{ds}\left(\dfrac{1+\dfrac{g_m}{G_3}+}{\dfrac{1}{r_{ds}G_3}}\right)+G_1 R_1 \end{pmatrix} = \quad (23)$$

-continued $$\begin{pmatrix} a & b \\ b & a \end{pmatrix}$$

A differential voltage $V_{out2}-V_{out1}$ is obtained by the equations (21) and (22), thereby obtaining an equation (24) as follows.

$$V_{out2} - V_{out1} = (-g_m r_{ds}) \frac{1}{a^2 - b^2} \quad (24)$$
$$(-bV_{in1} + aV_{in2} - aV_{in1} + bV_{in2})$$
$$= \frac{(-g_m r_{ds})}{a - b}(V_{in2} - V_{in1})$$
$$= \frac{(-g_m r_{ds})}{1 + G_1 r_{ds} + G_1 R_1}(V_{in2} - V_{in1})$$

The gain A of this circuit is defined as $A=|(V_{out2}-V_{out1})/(V_{in2}-V_{in1})|$, therefore, the gain A can be expressed by the equation (24) to an equation (25).

$$A = \left| \frac{V_{out2} - V_{out1}}{V_{in2} - V_{in1}} \right| \quad (25)$$
$$= \frac{g_m r_{ds}}{1 + G_1 r_{ds} + G_1 R_1}$$
$$= \frac{1}{\left(\frac{1}{g_m r_{ds}}\right) + \frac{G_1}{g_m} + \frac{G_1 R_1}{g_m r_{ds}}}$$

It is clear from the equation (25) that if the (drain) conductance of the constant current sources 21 and 22 and the resistors 23 and 24 cannot be disregarded, to increase the gain A, either $g_m \times r_{ds}$ is increased, or $G_1$ is decreased, or $R_1$ is decreased.

If a condition of $G_1 \times R_1 < g_m \times r_{ds}$ for the third term of the denominator is satisfied, the gain A can be increased even though the resistors 23 and 24 cannot be disregarded.

Figure 4:
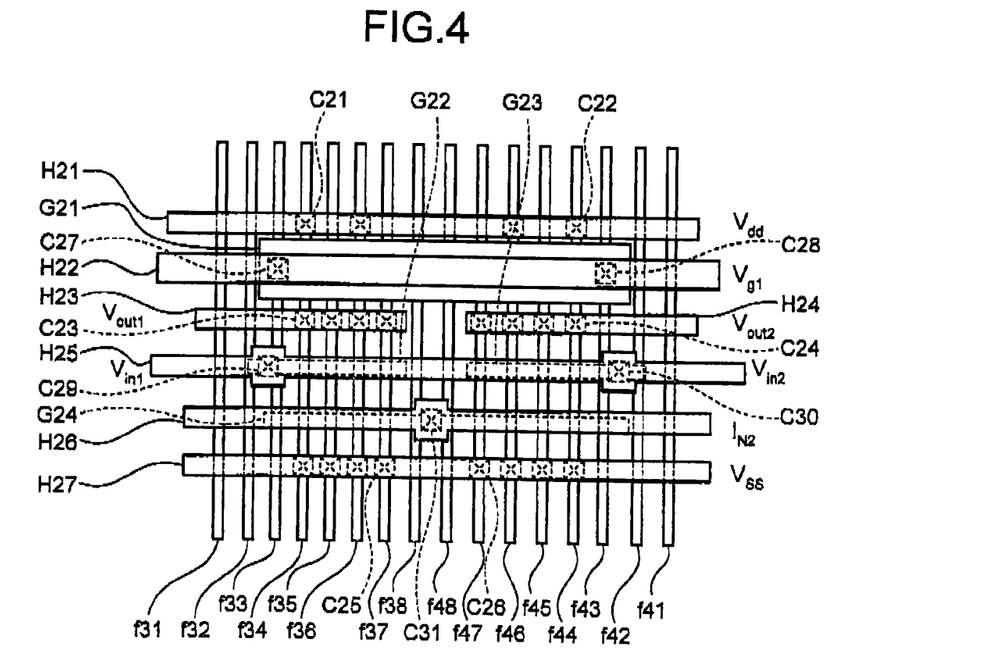
FIG. 4 is a plan view of a layout configuration of a semiconductor device according to a second embodiment.

FIG. 4 is a plan view of a layout configuration of a semiconductor device according to a second embodiment of the present invention.

In FIG. 4, plural fins f31 to f38 and f41 to f48 are aligned in parallel with each other. Preferably, the width of each of the fins f31 to f38 and f41 to f48 is equal to each other, and the interval between fins of the fins f31 to f38 and f41 to f48 is equal to each other. Preferably, the total number of the fins f31 to f38 and the total number of the fins f41 to f48 are even numbers. A semiconductor material can be used for the material of the fins f31 to f38 and f41 to f48. For example, the material can be selected from Si, Ge, SiGe, SiC, SiSn, PbS, GaAs, InP, GaP, GaN, ZnSe, and GaInAsP.

For the fins f33 to f38 and f43 to f48, gate electrode G21 is formed on both side surfaces of the fins f33 to f38 and f43 to f48 to cross the fins f33 to f38 and f43 to f48.

For the gate electrodes G21, gate electrodes G22 and G23 are aligned in parallel at a predetermined interval. For the fins f33 to f37, the gate electrode G22 is formed on both side surfaces of the fins f33 to f37 to cross the fins f33 to f37. For the fins f43 to f47, the gate electrode G23 is formed on both side surfaces of the fins f43 to f47 to cross the fins f43 to f47.

For the gate electrodes G22 and G23, gate electrode G24 is aligned in parallel at a predetermined interval. For the fins f33 to f37 and f43 to f47, the gate electrode G24 is formed on both side surfaces of the fins f33 to f37 and f43 to f47 to cross the fins f33 to f37 and f43 to f47.

Preferably, the gate electrode G21 can have a larger gate length than that of the gate electrodes G22 to G24. Preferably, a drain resistance in a saturation region of transistors having the gate electrode G21 is set to be assumed that it is substantially infinite ($dI_d/dV_d=1/R_d$ to 0). Preferably, the gate length of the gate electrodes G22 to G24 is set as small as possible to increase mutual conductance and to increase gain, and can be set equal to or smaller than 30 nanometers, for example.

Source/drain layers are formed in the fins f34 to f37 and f44 to f47 at both sides of the gate electrodes G21 to G24, respectively. The source/drain layers formed in the fins f34 to f37 between the gate electrode G21 and the gate electrode G22 are shared by the gate electrodes G21 and G22. The source/drain layers formed in the fins f44 to f47 between the gate electrodes G21 and G23 are shared by the gate electrodes G21 and G23. The source/drain layers formed in the fins f34 to f37 between the gate electrodes G22 and G24 are shared by the gate electrodes G22 and G24. The source/drain layers formed in the fins f44 to f47 between the gate electrodes G23 and G24 are shared by the gate electrodes G23 and G24.

The fins f34 to f37 and f44 to f47 at a drain side at the side of the gate electrode G21 is connected to a wiring H21 via contacts C21 and C22, respectively. The fins f34 to f37 at a source side at the side of the gate electrode G21 is connected to a wiring H23 via contacts C23. The fins f44 to f47 at a source side at the side of the gate electrode G21 is connected to a wiring H24 via contacts C24. The fins f34 to f37 and f44 to f47 at a source side at the side of the gate electrode G24 is connected to a wiring H27 via contacts C25 and C26, respectively.

The gate electrode G21 is connected to a wiring H22 via contacts C27 and C28, respectively. The gate electrode G22 is connected to a wiring H25 via contacts C29, and the gate electrode G23 is connected to the wiring H25 via contacts C30. The gate electrode G24 is connected to a wiring H26 via contacts C31. Metals such as Al, AlSiCu or Cu can be used for the material of the wirings H21 to H27.

Preferably, the contacts C22 to C26 are symmetrically aligned, respectively. Preferably, the gate electrodes G22 and G23 are aligned symmetrically with each other, and preferably, the wirings H23 and H24 are aligned symmetrically with each other. Embedded wirings formed on the fins f34 to f37 and f44 to f47 can be used for the contacts C21 to C26.

Out of the fins f31 to f38 and f41 to f48, the fins f31 to f32 and f41 and f42, those are aligned at both ends, can be used as dummy fins; They can not be used as a part of field-effect transistors.

Figure 5:
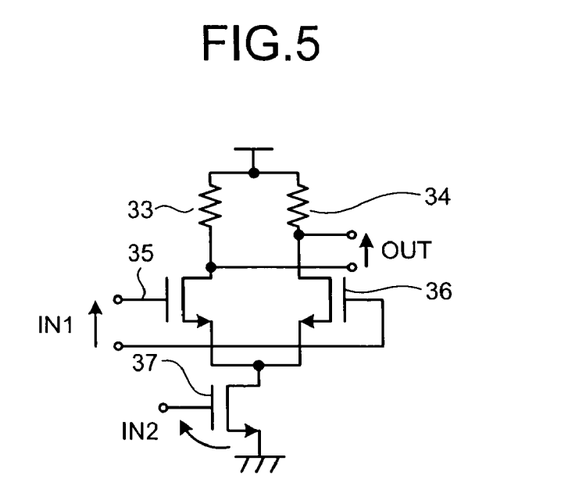
FIG. 5 depicts an equivalent circuit of the semiconductor device shown in FIG. 4.

FIG. 5 depicts an equivalent circuit of the semiconductor device shown in FIG. 4. The equivalent circuit is used for a mixer circuit or the like.

In FIG. 5, resistors 33 and 34 are connected to drains of field-effect transistors 35 and 36, respectively. A drain of a field-effect transistor 37 is connected in common to sources of the field-effect transistor 35 and 36. The resistors 33 and 34 can be configured by constant current sources.

The resistor 33 can be configured by the gate electrode G21 and the fins f34 to f37 shown in FIG. 4. The resistor 34 can be configured by the gate electrode G21 and the fins f44 to f47 shown in FIG. 4. The field-effect transistor 35 can be configured by the gate electrode G22 and the fins f34 to f37 shown in FIG. 4. The field-effect transistor 36 can be configured by the gate electrode G23 and the fins f44 to f47 shown in FIG. 4. The field-effect transistor 37 can be configured by the gate electrode G24 and the fins f34 to f37 and f44 to f47 shown in FIG. 4.

The wiring H21 shown in FIG. 4 is connected to the power source potential $V_{dd}$, and the wiring H27 is connected to the ground potential $V_{ss}$. If the input voltages $V_{in1}$ and $V_{in2}$ are input to the gate electrodes G22 and G23, respectively, and also if an input voltage IN2 is input to the gate electrode G24, the output voltages $V_{out1}$ and $V_{out2}$ are output from the wirings H23 and H24, respectively. As a result, a product of an input voltage IN1=$V_{in1}$-$V_{in2}$ and an input voltage IN2 is output as an output voltage OUT=$V_{out1}$-$V_{out2}$, thereby causing the field-effect transistors operate as mixers (multipliers).

Even though a gate length is decreased, a short-channel effect can be suppressed by using double-gate transistors for the field-effect transistors 35 to 37 shown in FIG. 5. Gain can be increased while suppressing degradation of a cutoff characteristic. A matching characteristic if the field-effect transistors 35 and 36 are differentially operated can be improved.

If the gate electrodes G22 and G23 are aligned to cross the plural fins f34 to f37 and f44 to f47, respectively, the parasitic resistance between the gate electrodes G21 and G22 and the parasitic resistance between the gate electrodes G21 and G23 can be decreased. Therefore, reduction of gain can be suppressed.

To decrease the parasitic resistance between the gate electrodes G21 and G22, the interval between the gate electrodes G21 and G22 is preferably as small as possible. It is also required that the gate electrodes G21 and G22 can be superimposed with the wiring H23. To decrease the parasitic resistance between the gate electrodes G21 and G23, the interval between the gate electrodes G21 and G23 is preferably as small as possible. It is also required that the gate electrodes G21 and G23 can be superimposed with the wiring H23.

If the gate length of the gate electrodes G21 is set larger than that of the gate electrodes G22 to G24, double-gate transistors can work as the resistors 33 and 34, as shown in FIG. 4. The resistors 33 and 34 connected to the field-effect transistors 35 and 36 can be formed in the same fins.

If the fins f31 to f38 and f41 to f48 are aligned at equal intervals, fin size controllability for the fins f31 to f38 and f41 to f48 can be improved. Consequently, a matching characteristic of a differential analog circuit can be improved.

The numbers of the fins f31 to f38 and f41 to f48 are set to even numbers, therefore, symmetry can be improved. The fins f31 to f38 and f41 to f48 can be formed by a sidewall transfer process. Further, an arrangement of the fins f31 to f38 and f41 to f48 can be reduced.

Out of the fins f31 to f38 and f41 to f48, the fins f11, f12, f21, and f22 are aligned at both ends, and are used as dummy fins. Therefore, such field-effect transistors can be manufactured, having the pattern regularity for the lithography and the etching process. Further, the variation of a DC characteristic of a threshold voltage and the like can be suppressed, and the degradation of short-channel effect can be also suppressed, because of the excellent pattern regularity.

If the numbers of the contacts C23 to C26 connected to the wirings H23, H24, and H27 are set larger than the numbers of the contacts C21 and C22 connected to the wiring H21, conductance of the resistors 33 and 34 can be decreased, and a current flowing to the field-effect transistors 35 and 36 can be increased, thereby improving the speed of the field-effect transistors 35 and 36.

If the contacts C21 to C26 are symmetrically aligned, a current path can be shortened because a current, entering the fins f34 and f36 via the contacts C21, can be spread to whole drain region of the field-effect transistor 35.

Even though the number of the contacts C11 connected to the wiring H11 is limited, increase of a delay time can be also suppressed thanks to the symmetrical contact allocation.

In the second embodiment, a method of using the fins f31, f32, f41, and f42, aligned at both ends as dummy fins out of the fins f31 to f38 and f41 to f48, is explained. Instead of using each two fins of the fins f31, f32, f41, and f42 aligned at both ends as dummy fins, each one of the fins aligned at both ends can be also used as a dummy fin. Alternatively, three or more fins aligned at both ends can be used as dummy fins.

In the second embodiment, a method of forming the contacts C21 and C22 connected to the wiring H21 is explained, in only the fins f34, f36, f44, and f46. However, the number of the contacts C21 and C22 connected to the wiring H21 is not necessarily limited to two, and can be any number larger than that of the contacts C23 and C24 connected to the wirings H23 and H24, respectively.

FIGS. 6A, 7A, 8A, and FIG. 9A are plan views of a method of manufacturing a fin structure according to a third embodiment of the present invention, and FIGS. 6B, 7B, 8B, and FIG. 9B are cross-sectional views of FIGS. 6A, 7A, 8A, and FIG. 9A, cut along a line A1-A1', line A2-A2', line A3-A3', and line A4-A4', respectively.

Figure 6A:
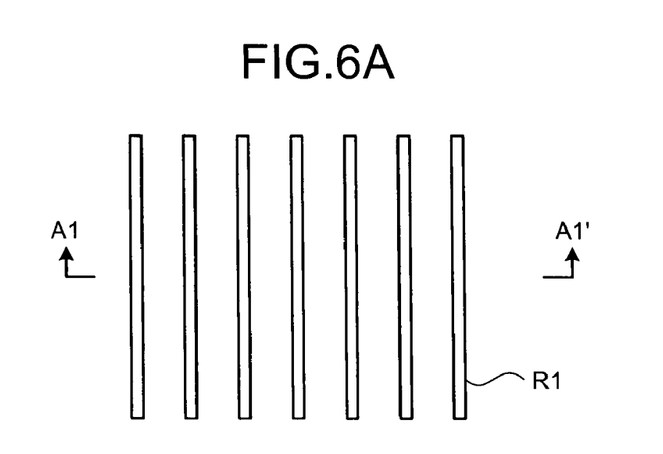
FIG. 6A is a plan view of a method of manufacturing a fin structure according to a third embodiment.
Figure 6B:
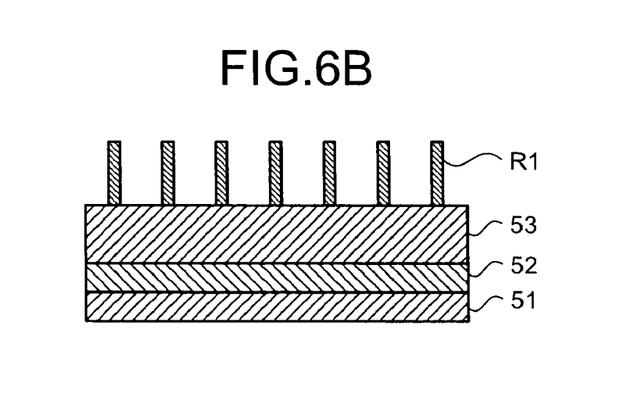
FIG. 6B is a cross-sectional view of FIG. 6A cut along a line A1-A1'.

In FIGS. 6A and 6B, a semiconductor layer 53 is formed on a semiconductor substrate 51 via an insulation layer 52. For the semiconductor substrate 51 on which the semiconductor layer 53 is formed via the insulation layer 52, an SOI substrate can be used, for example.

Dummy patterns R1 made of a first material are formed on the semiconductor layer 53. For the dummy patterns R1, linear patterns aligned in parallel with each other at a predetermined interval can be used. The interval between the dummy patterns R1 can be set as 2×F+H, where F represents the width of each fin 54 formed on the insulation layer 52, and H represents the interval between the finally formed fins 54.

Figure 7A:
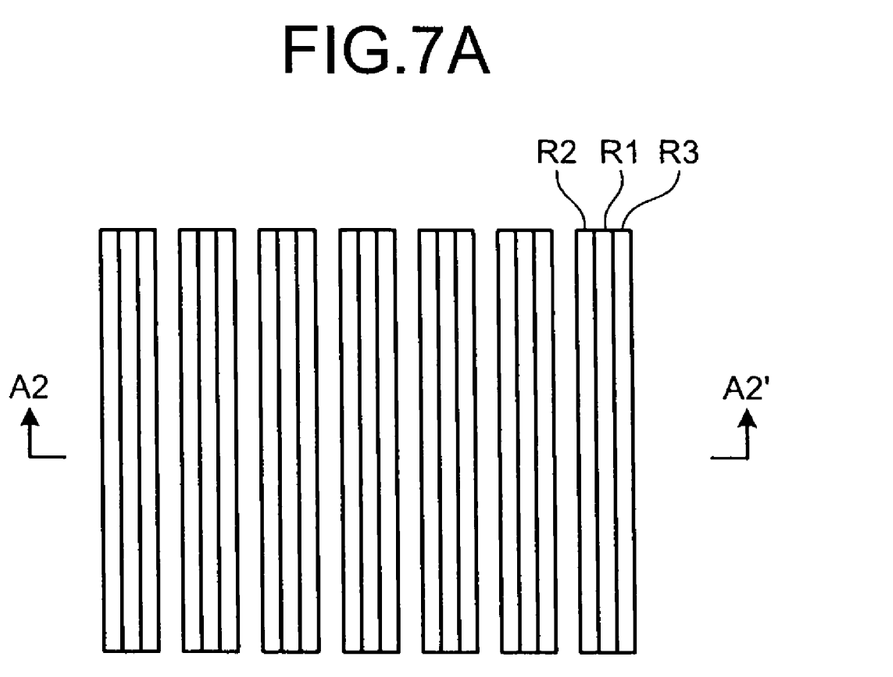
FIG. 7A is a plan view of the method of manufacturing a fin structure according to the third embodiment.
Figure 7B:
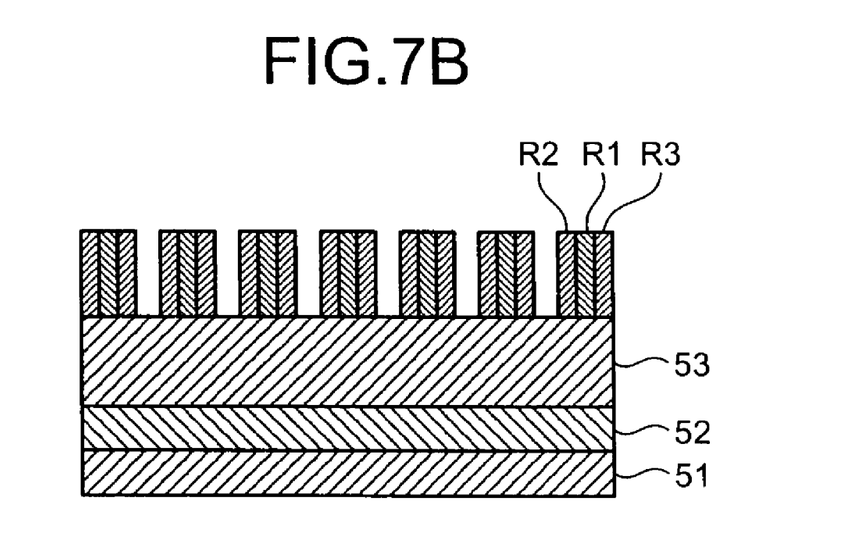
FIG. 7B is a cross-sectional view of FIG. 7A cut along a line A2-A2'.

As shown in FIGS. 7A and 7B, an insulation film made of a second material is formed on the semiconductor layer 53 so that a gap between the dummy patterns R1 is filled. By etching the insulation film by using anisotropic etching such as reactive ion etching (RIE), sidewall patterns R2 and R3 are formed on sidewalls of the dummy patterns R1. Film thicknesses of the sidewall patterns R2 and R3 can be controlled by an initial film thickness of the insulation film formed on the semiconductor layer 53 and by an etching time.

Figure 8A:
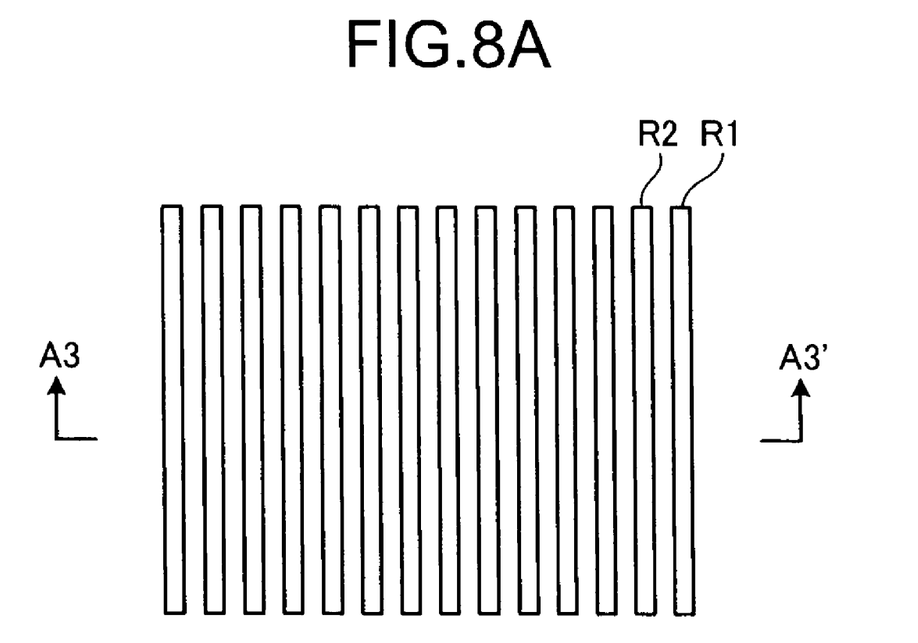
FIG. 8A is a plan view of the method of manufacturing a fin structure according to the third embodiment.
Figure 8B:
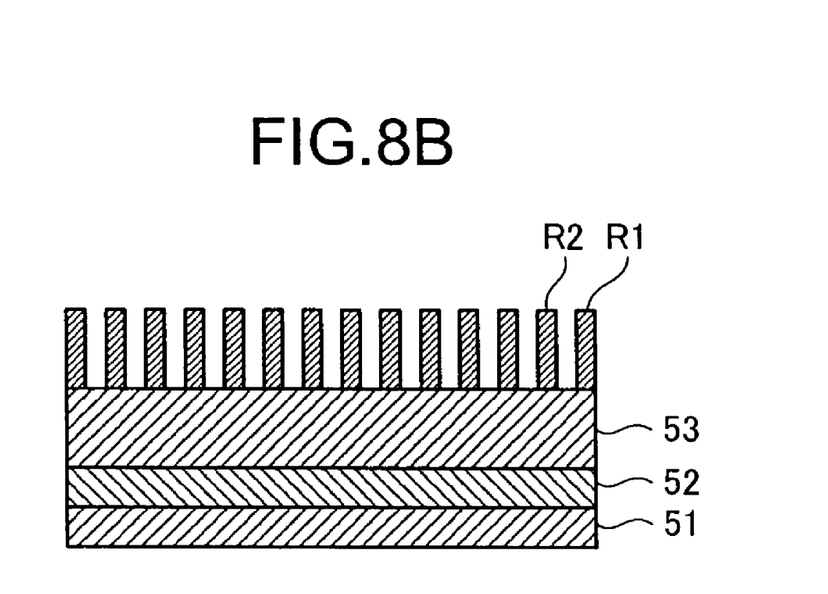
FIG. 8B is a cross-sectional view of FIG. 8A cut along a line A3-A3'.

The dummy patterns R1 are etched by using a difference of etching rate (=by utilizing etching selectivity) between the first material and the second material. Then, the dummy patterns R1 are removed from the semiconductor layer 53 by leaving the sidewall patterns R2 and R3 on the semiconductor layer 53, as shown in FIGS. 8A and 8B.

Figure 9A:
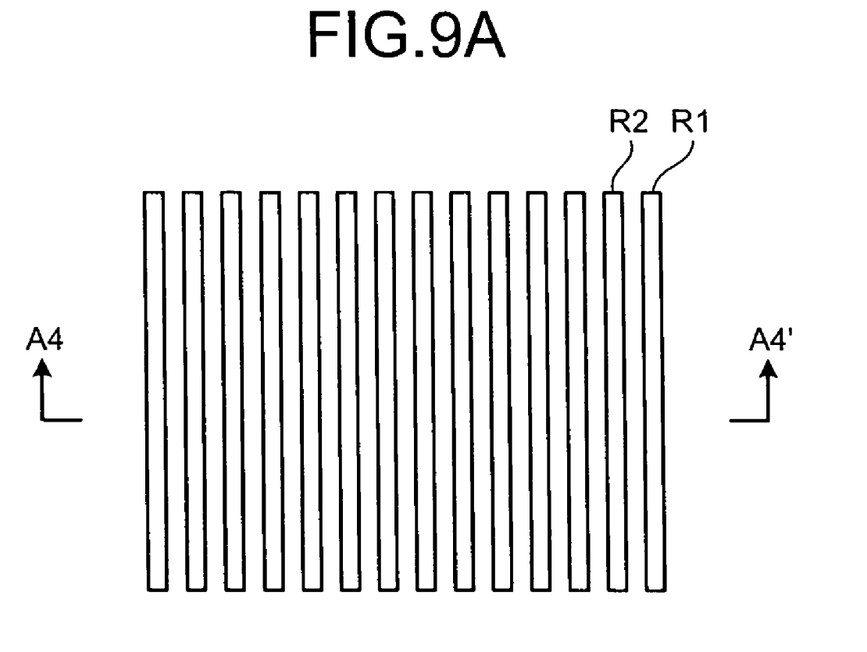
FIG. 9A is a plan view of the method of manufacturing a fin structure according to the third embodiment.
Figure 9B:
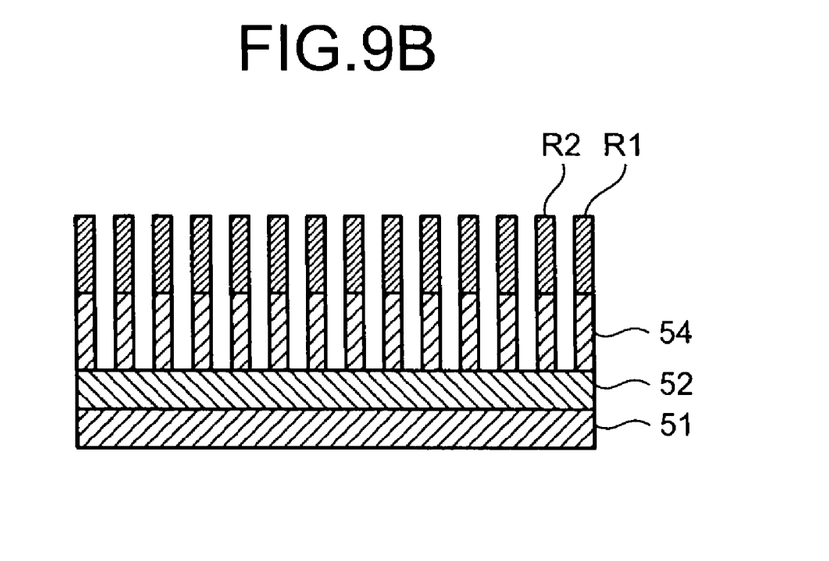
FIG. 9B is a cross-sectional view of FIG. 9A cut along a line A4-A4'.

Anisotropic etching such as RIE is performed to the semiconductor layer 53 by using the sidewall patters R2 and R3 as etching masks, thereby forming the fins 54 on the insulation layer 52, as shown in FIGS. 9A and 9B.

By the above arrangement, the fins 54 can be formed at a pitch two times of the resolution limit of a lithography process. As a result, the density of the fins 54 can be increased.

If the fins 54 are formed on the insulation layer 52, gate electrodes are formed on both side surfaces of the fins 54 to cross the fins 54 via gate dielectric films, and source/drain layers of the fins 54 are connected to a wiring via contacts, thereby manufacturing double-gate transistors shown in FIG. 1 or FIG. 4.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
N (N is an integer equal to or larger than 2) fins made of a semiconductor material aligned in parallel with each other;
a gate electrode formed on both side surfaces of the N fins to cross the fins;
source/drain layers formed in each of the N fins by sandwiching the gate electrode;
a first wiring connected to one of the source/drain layers via a first contact formed in M fins (M is an integer equal to or larger than 2 and equal to or smaller than N); and
a second wiring connected to the other one of the source/drain layers via a second contact formed in K fins (K is an integer smaller than M) and isolated from the first wiring, wherein the first and second contacts are associated with the same gate electrode.

2. The semiconductor device according to claim 1, further comprising at least one dummy fin aligned in parallel at outside of the N fins.

3. The semiconductor device according to claim 1, wherein widths of the fins are equal to each other, and intervals between the fins are also equal to each other.

4. The semiconductor device according to claim 1, wherein the first contact is aligned in the M fins to be symmetrical with each other in the top view plain, and the second contact is aligned in the K fins to be symmetrical with each other in the top view plain.

5. The semiconductor device according to claim 1, wherein the fins are not doped with impurity.

6. The semiconductor device according to claim 1, wherein the gate electrode is configured by metal compounds.

* * * * *